(12) United States Patent
Lee et al.

(10) Patent No.: US 7,521,347 B2
(45) Date of Patent: Apr. 21, 2009

(54) METHOD FOR FORMING CONTACT HOLE IN SEMICONDUCTOR DEVICE

(75) Inventors: Dong-Yeol Lee, Ichon-shi (KR); Dong-Goo Choi, Ichon-shi (KR); Dong-Sauk Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 280 days.

(21) Appl. No.: 11/448,714

(22) Filed: Jun. 8, 2006

(65) Prior Publication Data

US 2007/0148964 A1 Jun. 28, 2007

(30) Foreign Application Priority Data

Dec. 28, 2005 (KR) ........................ 10-2005-0132585

(51) Int. Cl.
*H01L 21/44* (2006.01)
(52) U.S. Cl. .................. 438/597; 438/618; 438/637; 257/E21.577
(58) Field of Classification Search .................. 438/253, 438/275, 618, 637, 238, 256, 597, 672, 675, 438/702; 257/758, E1.577, E21.577, E27.097
See application file for complete search history.

(56) References Cited

U.S. PATENT DOCUMENTS 6,342,416 B1 *   1/2002   Kim et al. .................... 438/239
6,350,649 B1 *   2/2002   Jeong et al. .................. 438/256
6,451,708 B1 *   9/2002   Ha ............................... 438/738
6,660,652 B2 * 12/2003   Kim et al. .................... 438/734
6,730,975 B2     5/2004   Park et al.

FOREIGN PATENT DOCUMENTS

KR   10-2005-0067568 A   7/2005

* cited by examiner

*Primary Examiner*—Khiem D Nguyen
(74) *Attorney, Agent, or Firm*—Finnegan, Henderson, Farabow, Garrett & Dunner, L.L.P.

(57) ABSTRACT

A method for forming a contact hole in a semiconductor device includes forming gate lines on a substrate, forming a bit line pattern by forming a bit line and a bit line hard mask in sequential order over the substrate, forming an inter-layer insulation layer having a multiple-layer structure including an etch stop layer over the substrate, forming a contact mask over the inter-layer insulation layer, performing a first etching process to etch a first portion of the inter-layer insulation layer above the etch stop layer, using the contact mask as an etch mask, and performing a second etching process to etch the etch stop layer, a second portion of the inter-layer insulation layer below the etch stop layer, and the bit line hard mask to form a contact hole exposing a portion of the bit line.

19 Claims, 5 Drawing Sheets

METHOD FOR FORMING CONTACT HOLE IN SEMICONDUCTOR DEVICE

RELATED APPLICATION

This application is based upon and claims the benefit of priority from the prior Korean Patent Application No. 2005-132585, filed Dec. 28, 2005, the entire contents of which are incorporated herein by reference.

TECHNICAL FIELD

The present invention relates to a method for fabricating a semiconductor device, and more particularly, to a method for forming a contact hole in a semiconductor device.

DESCRIPTION OF RELATED ARTS

In a dynamic random access memory (DRAM) having a capacitor-on-bit-line (COB) structure, forming a metal contact (M1C) coupling a metal line and a bottom bit line is difficult when an aspect ratio of the capacitor is 20:1 or higher, because of an etch selectivity between a substrate and a photoresist mask, a contact hole opening and critical dimension (CD) uniformity within a wafer, and distortion of a contact hole. Also, because of a twist of a contact hole, there may be insufficient overlap between the overlap and a bit line.

FIG. 1 shows micrographic views illustrating a twist of a typical metal contact hole. Because of the twist of the contact hole and therefore the insufficient overlap between the contact hole and a bit line, a bottom gate or an active region of the substrate may be etched when forming the contact hole, resulting in a defect affecting the function of the device. Thus, a yield decreases. To reduce the etching of the bottom gate and the active region during the formation of the contact hole, an etching time of the contact hole may be reduced. However, reducing the etching time of the contact hole results in a smaller bottom surface of the contact hole and, consequently, an increased contact resistance. Also, in places where an etching speed is lower than in other places, contact holes may not be formed at all. Furthermore, if tungsten, which has a low sheet resistance (Rs), is used to form bit lines, a tungsten punch event may occur during an etching process, a subsequent post etch treatment (PET), or a light etch treatment (LET) for forming a metal contact hole. FIG. 2 is a micrographic view illustrating a tungsten punch event often occurring when a typical contact process is employed.

SUMMARY

Consistent with embodiments of the present invention, there is provided a method for forming a contact hole in a semiconductor device, which can prevent a twist of a metal contact hole during an etching for forming the metal contact hole, and which can also prevent a punch event of a material used for forming a bit line.

A method for forming a contact hole in a semiconductor device consistent with embodiments of the present invention includes: forming gate lines on a substrate; forming a bit line pattern by forming a bit line and a bit line hard mask in sequential order over the substrate; forming an inter-layer insulation layer having a multiple-layer structure including an etch stop layer over the substrate; forming a contact mask over the inter-layer insulation layer; performing a first etching process to etch a first portion of the inter-layer insulation layer above the etch stop layer, using the contact mask as an etch mask; and performing a second etching process to etch the etch stop layer, a second portion of the inter-layer insulation layer below the etch stop layer, and the bit line hard mask to form a contact hole exposing a portion of the bit line.

Another method for forming a contact hole in a semiconductor device consistent with embodiments of the present invention includes: forming a first conductive line on a substrate; forming a conductive pattern by forming a second conductive line and a hard mask in sequential order over the substrate; forming an inter-layer insulation layer having a multiple-layer structure including an etch stop layer over the substrate; forming a contact mask over the inter-layer insulation layer; performing a first etching process to etch a first portion of the inter-layer insulation layer above the etch stop layer, using the contact mask as an etch mask; and performing a second etching process to etch the etch stop layer, a second portion of the inter-layer insulation layer below the etch stop layer, and the hard mask to form a contact hole exposing a portion of the second conductive line.

Additional features and advantages of the invention will be set forth in part in the description which follows, and in part will be apparent from that description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The above and other features will become better understood with respect to the following description of the specific embodiments given in conjunction with the accompanying drawings, in which.

DETAILED DESCRIPTION

A method for forming a contact hole in a semiconductor device consistent with the present invention will be described in detail with reference to the accompanying drawings.

Figure 1:
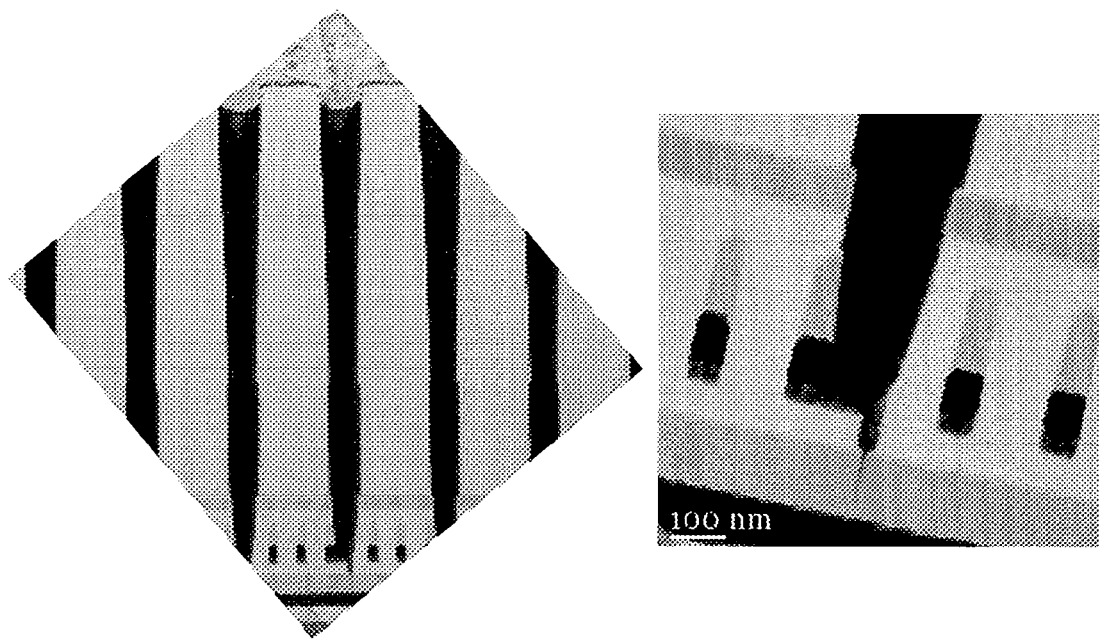
FIG. 1 shows micrographic views illustrating a twist in a typical metal contact hole.
Figure 2:
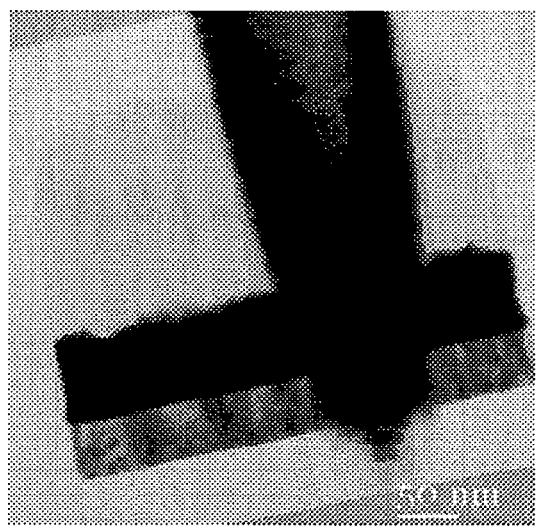
FIG. 2 is a micrographic view illustrating a tungsten punch event often occurring when a typical contact process is employed.
Figure 3A:
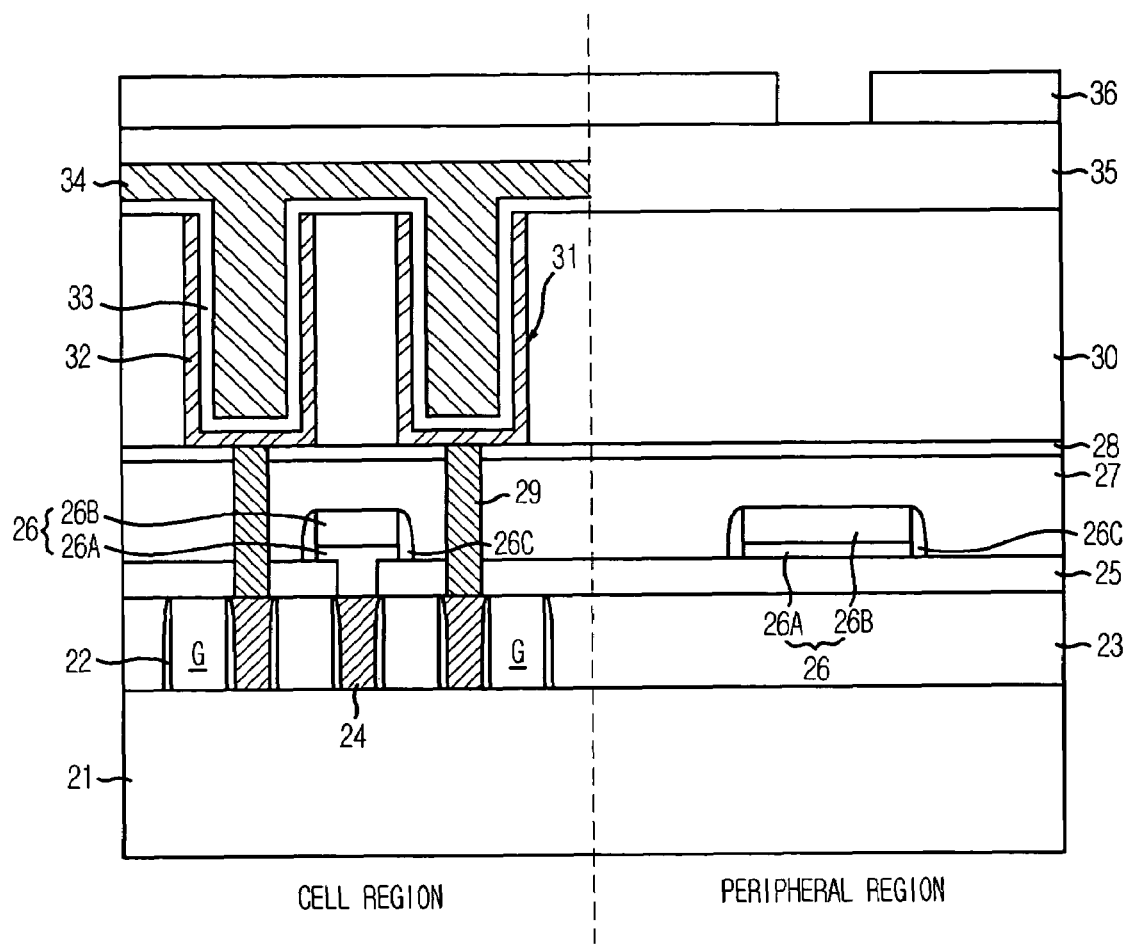
FIGS. 3A to 3C are cross-sectional views illustrating a method for forming a contact hole in a semiconductor device consistent with the present invention.
Figure 3B:
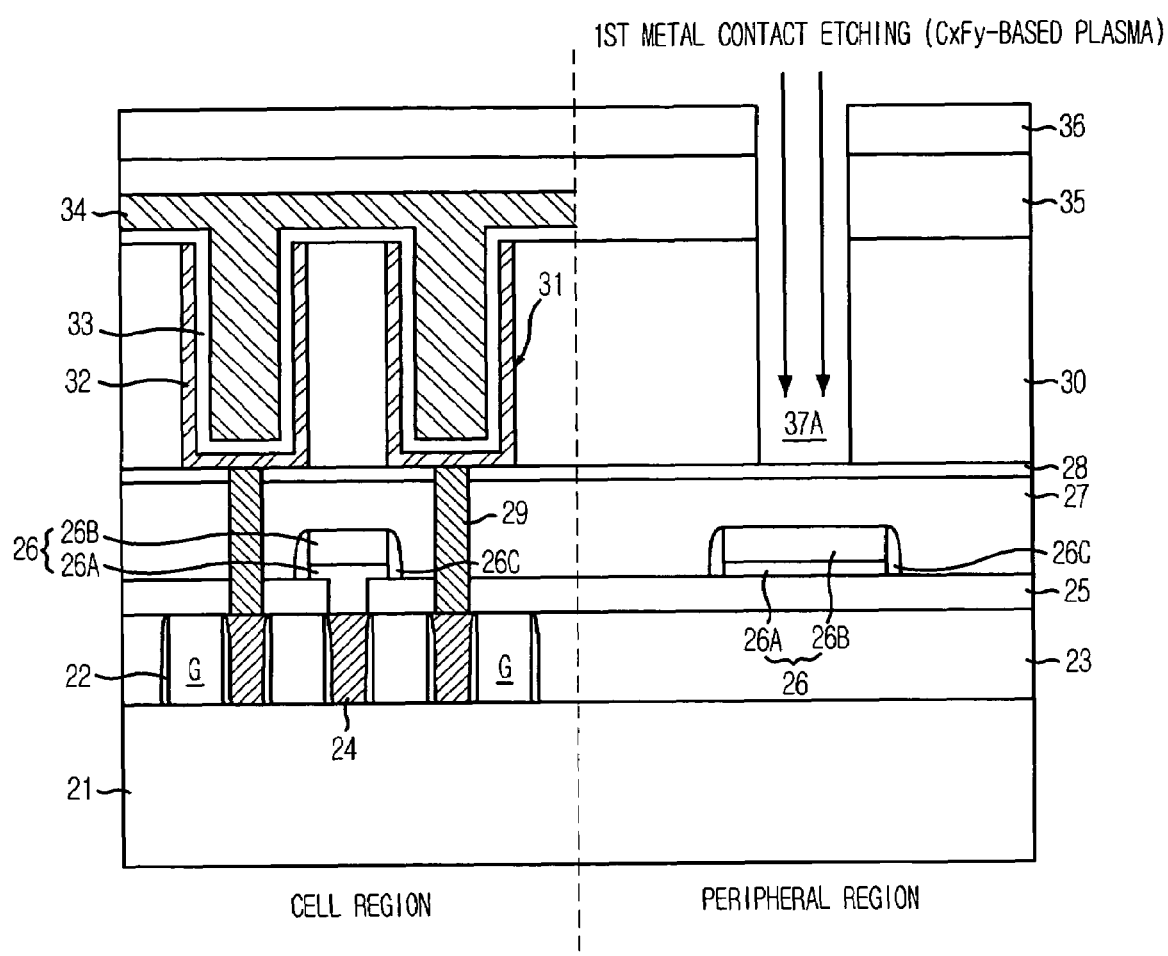
Figure 3C:
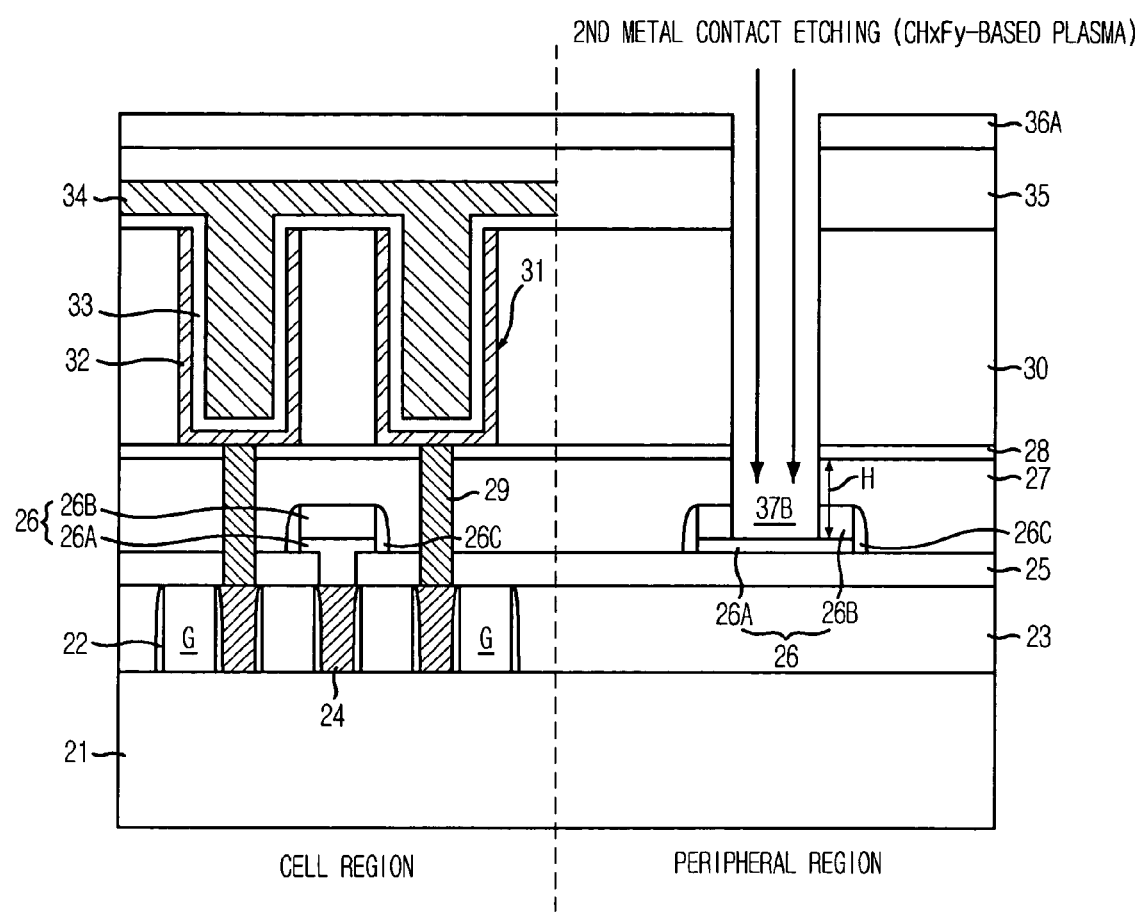

FIGS. 3A to 3C are cross-sectional views illustrating a method for forming a contact hole in a semiconductor device consistent with the present invention.

As shown in FIG. 3A, gate lines G are formed in a cell region of a substrate 21, wherein the substrate 21 includes the cell region and a peripheral region. Gate spacers 22 are formed on both sidewalls of the gate lines G. Gate lines G may comprise a gate oxide layer, a gate conductive layer, and a gate hard mask, formed in sequential order.

Landing plug contacts (LPC) 24 are formed in the cell region, and are isolated from each other by a first inter-layer insulation layer 23 formed over the gate lines G and partially contacting the substrate 21. The LPCs 24 are formed by: forming the first inter-layer insulation layer 23; performing a chemical mechanical polishing (CMP) process up to a top portion of the gate lines G; forming contact holes by selectively etching the first inter-layer insulation layer 23; depositing polysilicon, filling the contact holes; and performing an etch-back process or a CMP process.

A second inter-layer insulation layer 25 is formed over the first inter-layer insulation layer 23, the LPCs 24, and the gate lines G. The second inter-layer insulation layer 25 is selectively etched to form a bit line contact hole in the cell region. Then, bit line patterns 26 are formed. FIG. 3A shows that one of the bit line patterns 26 is formed in the cell region contacting one of the LPCs 24 through the bit line contact hole and that another one of the bit line patterns 26 is formed simultaneously in the peripheral region. Each of the bit line patterns 26 includes a bit line 26A and a bit line hard mask 26B formed in sequential order. The bit line 26A comprises tungsten, and the bit line hard mask 26B comprises nitride. Bit line spacers 26C are formed on both sidewalls of each of the bit line patterns 26. The bit line spacers 26C are formed through a nitride formation and an etch-back process.

A third inter-layer insulation layer 27 is formed over the above resulting substrate structure including the bit line patterns 26, and then the third inter-layer insulation layer 27 is planarized. An etch stop layer 28 is formed over the third inter-layer insulation layer 27. The etch stop layer 28 comprises nitride and has a thickness ranging from approximately 400 Å to approximately 800 Å.

Predetermined portions of the etch stop layer 28, the third inter-layer insulation layer 27, and the second insulation layer 25 on both sides of the bit line pattern 26 in the cell region are etched to form storage node contact (SNC) holes, exposing a top portion of some of the LPCs 24. Then, a metal is buried in the SNC holes to form storage node contacts (SNCs) 29.

A fourth inter-layer insulation layer 30 is formed over the etch stop layer 28 and the SNCs 29. The fourth inter-layer insulation layer 30 is formed to provide capacitor structures, that is, trenches where storage nodes of capacitors are to be formed through a storage node etching. The fourth inter-layer insulation layer 30 has a thickness ranging from approximately 14,000 Å to approximately 28,000 Å.

Predetermined portions of the fourth inter-layer insulation layer 30 and the etch stop layer 28 are etched to form 3-dimensional trenches 31 in the cell region, exposing a portion of each SNC 29. Storage nodes 32 of the capacitors are formed inside the trenches 31.

A dielectric layer 33 and a plate node 34 are sequentially formed in the cell region to complete the capacitors. Thus, the capacitors have a concave structure and include the storage nodes 32, the dielectric layer 33, and the plate node 34. The capacitors may have a cylinder structure if the fourth inter-layer insulation layer 30 is selectively dipped out after the plate node 34 is formed, and the capacitors may have the concave structure if the fourth inter-layer insulation layer 30 remains. Hereinafter, the capacitors are assumed to have a concave structure.

A fifth inter-layer insulation layer 35 is formed over the fourth inter-layer insulation layer 30 and the plate node 34 to provide insulation between the capacitors and a metal line to be formed, and then the fifth inter-layer insulation layer 35 is planarized. The fifth inter-layer insulation layer 35 has a thickness ranging from approximately 3,000 Å to approximately 5,000 Å. A photoresist layer is formed over the fifth inter-layer insulation layer 35, and then a photo-exposure and developing processes are performed to pattern the photoresist layer to thereby form a metal contact mask 36.

A metal contact etching process using the metal contact mask 36 as an etch mask is then performed. The metal contact etching process is a contact process for forming metal lines contacting the plate nodes of the capacitors and metal lines contacting an active region and the bit lines 26A in the peripheral region. Generally, the metal contact etching process is referred to as the "M1C" process, and includes two steps consistent with the present invention. Although the metal contact etching process is performed for forming metal lines both in the cell region and in the peripheral region, the following descriptions assume for convenience that the metal contact etching process only exposes a top portion of the bit line 26A in the peripheral region.

To expose the top portion of the bit line 26A in the peripheral region, the insulation structure including the five layers of insulating materials, i.e., the bit line hard mask 26B, the third inter-layer insulation layer 27, the etch stop layer 28, the fourth inter-layer insulation layer 30, and the fifth inter-layer insulation layer 35, is etched, where the bit line hard mask 26B and the etch stop layer 28 each comprises a nitride, and the third inter-layer insulation layer 27, the fourth inter-layer insulation layer 30, and the fifth inter-layer insulation layer 35 each comprises an oxide such as borophosphosilicate glass (BPSG).

As shown in FIG. 3B, a first step of the metal contact etching process for contacting the bit line 26A in the peripheral region is performed. During the first step of the metal contact etching process, portions of the fifth inter-layer insulation layer 35 and the fourth inter-layer insulation layer 30 over the bit line pattern 26 are etched using the metal contact mask 36 as an etch mask to form a contact hole 37A. The first step of the metal contact etching process uses a plasma of a carbon fluoride-based ($C_xF_y$) gas as a main etching gas, which has an etch selectivity between oxide and nitride to be approximately 5:1. Thus, because the etch stop layer 28 comprises a nitride, and the fourth inter-layer insulation layer 30 and the fifth inter-layer insulation layer 35 each comprises an oxide, the first step of the metal contact etching process stops at the etch stop layer 28.

Consistent with the present invention, to avoid a failure to open a contact hole in places where an etching speed is lower than in other places, the first step of the metal contact etching process is performed to overetch the fourth inter-layer insulation layer 30 and the fifth inter-layer insulation layer 35. In other words, the first step of the metal contact etching process is performed for a period of time longer than an average time required for etching through the fourth inter-layer insulation layer 30 and the fifth inter-layer insulation layer 35. In one aspect, an overetch time, i.e., an excess of the time of the first step of the metal contact etching process over the average time, is approximately 5% to approximately 25% of the average time. Thus, the contact hole 37A reaches and stops at the etch stop layer 28 even in places where the etching speed of the first step of the metal contact etching process is slow due to non-uniformity of the etching.

In one aspect, during the first step of the metal contact etching process, a plasma of hexafluorobutadiene 1,3-($C_4F_6$) is used as the main etching gas, and a plasma of a mixed gas including oxygen ($O_2$)/argon (Ar) is added to the plasma of $C_4F_6$. The gas mixture of $C_4F_6/O_2/Ar$ results in an etch selectivity between oxide and nitride greater than approximately 5:1, e.g., approximately 5:1 to approximately 10:1.

As shown in FIG. 3C, a second step of the metal contact etching process is performed subsequently. During the second step of the metal contact etching process, the etch stop layer 28 remaining below the contact hole 37A, the third inter-layer insulation layer 27, and the bit line hard mask 26B are sequentially etched to expose the bit line 26A, using the metal contact mask 36 as an etch mask. As a result, a metal contact hole 37B exposing the bit line 26A is formed. The metal contact mask 36 is also partially etched, resulting in a metal contact mask 36A with reduced thickness.

Even if the metal contact hole 37B is twisted and deviated from the bit line 26A, the metal contact hole 37B can be prevented from contacting bottom structures, i.e., gate lines or active region, by setting up an appropriate level of over etching. This results because a height H of the remaining insulation structure below the etch stop layer is small.

The second step of the metal contact etching process etches the etch stop layer 28 and the bit line hard mask 26B, both including nitride, and the third inter-layer insulation layer 27, which includes oxide. Therefore, a $CH_xF_y$-based plasma which has similar etching speed for both nitride and oxide is used as a main etching gas. In one aspect, the second step of the metal contact etching process overetches the etch stop layer 28, the third inter-layer insulation layer 27, and the bit line hard mask 26B, by an overetch time approximately 30% to approximately 50% of an average time required to etch through the etch stop layer 28, the third inter-layer insulation layer 27, and the bit line hard mask 26B, a total thickness of which is H. In another aspect, the overetch time is a time required to etch approximately ½ to approximately ⅔ of a height from the bit line 26A to the gate lines G or the active region at the bottom.

In one aspect, during the second metal contact etching process, a plasma of $CH_2F_2$ gas is used as the main etching gas, and a plasma of a mixed gas including octafluorocyclobutane $(C_4F_8)/O_2/Ar$ is added to the plasma of $CH_2F_2$. The gas mixture of $CH_2F_2/C_4F_8/O_2/Ar$ results in a similar etching speed for nitride and oxide. More specifically, the gas mixture of $CH_2F_2/C_4F_8/O_2/Ar$ gives an etching selectivity between nitride and oxide ranging from approximately 0.8:1 to approximately 1.2:1.

The first and the second steps of the metal contact etching processes can be performed in one equipment in-situ or in separate equipments ex-situ. Between the first step of the metal contact etching process and the second step of the metal contact etching process, a cleaning process may be performed in-situ or ex-situ in an atmosphere selected from a group consisting of $O_2$, $O_2/Ar$, $O_2$/carbon monoxide (CO)/Ar, and $O_2$/nitrogen($N_2$) plasma, to remove polymer generated during the first step of the metal contact etching process.

Figure 4:
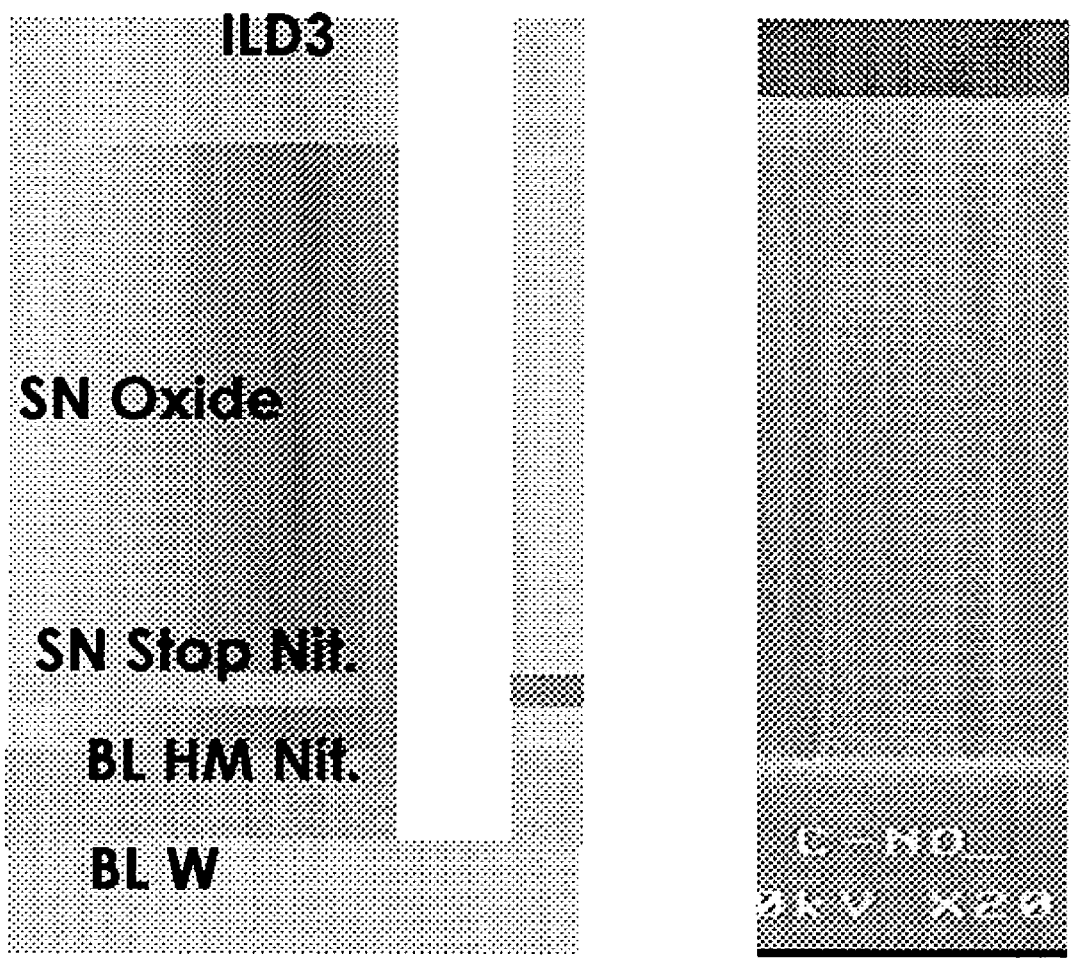
FIG. 4 is a micrographic image of scanning electron microscopy (SEM) illustrating a metal contact hole consistent with the present invention.

FIG. 4 is a micrographic image of scanning electron microscopy (SEM) illustrating a metal contact hole formed by methods consistent with the present invention. In particular, the metal contact hole was formed by performing the first step of the metal contact etching process consistent with the present invention using a mixed plasma of $C_4F_6/O_2/Ar$, and with an overetch time approximately 15% of an average time required to etch through the oxide layer ("SN Oxide") above the stop layer ("SN Stop Nit."). The second step of the metal contact etching process consistent with the present invention is performed using a mixed plasma of $CH_2F_2/C_4F_8/O_2/Ar$, and with an overetch time approximately 50% of an average time required to etch through the stop layer until the bit line ("BL W").

The metal contact etching process consistent with the present invention forms metal contact holes with two etching steps, each step overetching material layers intended to be etched. Such overetchings prevent electrical connection between a bit line and a bottom conductive layer and result in uniform critical dimension (CD) of the metal contact holes. Consequently, limitations arising from a twist of metal contact hole and a possible tungsten punch event associated with the typical etching process including a single etching process for forming metal contact holes are obviated.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a contact hole in a semiconductor device, the method comprising:
   forming gate lines on a substrate including a cell region and a peripheral region;
   forming a bit line pattern by forming a bit line and a bit line hard mask in a sequential order over the substrate;
   forming an inter-layer insulation layer having a multiple-layer structure including an etch stop layer over the substrate;
   forming a contact mask over the inter-layer insulation layer;
   performing a first etching process to etch a first portion of the inter-layer insulation layer in the peripheral region up to the etch stop layer exposed, using the contact mask as an etch mask; and
   performing a second etching process to etch the exposed etch stop layer, a second portion of the inter-layer insulation layer below the exposed etch stop layer, and the bit line hard mask to form a contact hole exposing a portion of the bit line.

2. The method of claim 1, wherein performing the first etching process includes performing the first etching process which etches the first portion of the inter-layer insulation layer at a faster speed than the etch stop layer.

3. The method of claim 2, wherein performing the first etching process includes performing the first etching process with an etch selectivity between the first portion of the inter-layer insulation layer and the etch stop layer to be at least approximately 5:1.

4. The method of claim 1, wherein performing the first etching process includes using a plasma of a carbon fluoride-based gas.

5. The method of claim 4, wherein performing the first etching process further includes adding a plasma of a mixed gas including oxygen ($O_2$)/argon (Ar) to the carbon fluoride-based gas.

6. The method of claim 1, wherein performing the first etching process includes overetching the first portion of the inter-layer insulation layer by an overetch time approximately 5% to approximately 25% of an average time required to etch through the first portion of the inter-layer insulation layer.

7. The method of claim 1, wherein the second etching process is performed with an etch selectivity between the etch stop layer and the second portion of the inter-layer insulation layer ranging from approximately 0.8:1 to approximately 1.2:1.

8. The method of claim 1, wherein performing the second etching process includes using a plasma of a $CH_xF_y$-based gas.

9. The method of claim 8, wherein performing the second etching process further includes adding a plasma of a mixed gas including $C_4F_8/O_2/Ar$ to the $CH_xF_y$-based gas.

10. The method of claim 1, wherein performing the second etching process includes overetching the exposed etch stop layer, the second portion of the inter-layer insulation layer, and the bit line hard mask by an overetch time approximately 30% to approximately 50% of an average time required to etch through the exposed etch stop layer, the second portion of the inter-layer insulation layer below the etch stop layer, and the bit line hard mask.

11. The method of claim 10, wherein the overetching includes overetching the exposed etch stop layer, the second portion of the inter-layer insulation layer below the etch stop layer, and the bit line hard mask by a time required to etch approximately ½ to approximately ⅔ of a height from the bit line to the gate lines.

12. The method of claim 11, wherein the overetching includes overetching the exposed etch stop layer, the second portion of the inter-layer insulation layer below the etch stop layer, and the bit line hard mask by a time required to etch approximately ½ to approximately ⅔ of a height from the bit line to the substrate.

13. The method of claim 1, wherein the bit line hard mask and the etch stop layer include a nitride-based material, and the first portion and the second portion of the inter-layer insulation layer include an oxide-based material.

14. The method of claim 1, further comprising performing a cleaning process between the performing of the first etching process and the performing of the second etching process to remove polymer generated during the first etching process.

15. The method of claim 14, wherein the cleaning process is performed in one of an in-situ condition and an ex-situ condition in an atmosphere selected from the group consisting of $O_2$, $O_2$/Ar, $O_2$/carbon monoxide (CO)/Ar, and $O_2$/nitrogen ($N_2$) plasma.

16. A method for forming a contact hole in a semiconductor device, the method comprising:
    forming a first conductive line on a substrate including a cell region and a peripheral region;
    forming a conductive pattern by forming a second conductive line and a hard mask in a sequential order over the substrate;
    forming an inter-layer insulation layer having a multiple-layer structure including an etch stop layer over the substrate;
    forming a contact mask over the inter-layer insulation layer;
    performing a first etching process to etch a first portion of the inter-layer insulation layer in the peripheral region up to the etch stop layer exposed, using the contact mask as an etch mask; and
    performing a second etching process to etch the exposed etch stop layer, a second portion of the inter-layer insulation layer below the exposed etch stop layer, and the hard mask to form a contact hole exposing a portion of the second conductive line.

17. The method of claim 16, wherein performing the first etching process includes performing the first etching process with an etch selectivity between the first portion of the inter-layer insulation layer and the etch stop layer to be at least approximately 5:1.

18. The method of claim 16, wherein performing the first etching process includes overetching the first portion of the inter-layer insulation layer by an overetch time approximately 5% to approximately 25% of an average time required to etch through the first portion of the inter-layer insulation layer.

19. The method of claim 16, wherein performing the second etching process includes overetching the exposed etch stop layer, the second portion of the inter-layer insulation layer, and the hard mask by an overetch time approximately 30% to approximately 50% of an average time required to etch through the exposed etch stop layer, the second portion of the inter-layer insulation layer below the etch stop layer, and the hard mask.

* * * * *